United States Patent
Oh et al.

(10) Patent No.: US 9,953,828 B2
(45) Date of Patent: Apr. 24, 2018

(54) FRAME AND MASK ASSEMBLY HAVING THE SAME

(71) Applicant: Samsung Display Co., Ltd., Yongin, Gyeonggi-Do (KR)

(72) Inventors: Yoon-Chan Oh, Yongin (KR); Choong-Ho Lee, Yongin (KR); Da-Hee Jeong, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 574 days.

(21) Appl. No.: 13/918,352

(22) Filed: Jun. 14, 2013

(65) Prior Publication Data

US 2014/0033975 A1 Feb. 6, 2014

(30) Foreign Application Priority Data

Aug. 3, 2012 (KR) ........................ 10-2012-0085354

(51) Int. Cl.
*H01L 21/02* (2006.01)
*B05C 21/00* (2006.01)
*C23C 14/04* (2006.01)

(52) U.S. Cl.
CPC ...... *H01L 21/02104* (2013.01); *B05C 21/005* (2013.01); *C23C 14/042* (2013.01)

(58) Field of Classification Search
None
See application file for complete search history.

(56) References Cited

U.S. PATENT DOCUMENTS

| 5,844,650 | A | 12/1998 | Saito et al. |
| 6,577,051 | B2 | 6/2003 | Kwon et al. |
| 6,858,086 | B2 | 2/2005 | Kang |
| 7,718,031 | B2 | 5/2010 | Kang et al. |
| 8,286,579 | B2 | 10/2012 | Sung et al. |
| 2005/0115503 | A1* | 6/2005 | Hagiwara et al. ............ 118/721 |
| 2006/0158088 | A1 | 7/2006 | Kim et al. |
| 2010/0055810 | A1* | 3/2010 | Sung ..................... C23C 14/042 438/22 |
| 2010/0192856 | A1* | 8/2010 | Sung et al. ................... 118/721 |
| 2012/0234235 | A1* | 9/2012 | Lee ....................... C23C 14/042 118/504 |

FOREIGN PATENT DOCUMENTS

| CN | 1824825 A | 8/2006 |
| CN | 101798670 A | 8/2010 |
| JP | 2005171290 A | 6/2005 |

(Continued)

OTHER PUBLICATIONS

The Japanese Office Action dated Aug. 1, 2017, issued in Japanese Patent Application No. 2013-081005.

(Continued)

*Primary Examiner* — Jethro M Pence
(74) *Attorney, Agent, or Firm* — H.C. Park & Associates, PLC

(57) ABSTRACT

A frame and a mask assembly having the same. The frame supports both ends of each unit mask, each unit mask applying a tensile force in a first direction. The frame includes a frame main body part forming an opening exposing the unit mask, and a first through hole formed by passing through the frame main body part.

20 Claims, 7 Drawing Sheets

(56) References Cited

FOREIGN PATENT DOCUMENTS

| | | | | |
|---|---|---|---|---|
| JP | 2006-188752 | | 7/2006 | |
| JP | 2009127127 A | | 6/2009 | |
| JP | 2010135269 | * | 6/2010 | ............ C23C 14/04 |
| JP | 2010135269 A | | 6/2010 | |
| KR | 100319323 B1 | | 1/2002 | |
| KR | 10-2006-0080480 | | 7/2006 | |
| KR | 1020060102838 | * | 9/2006 | ............ H05B 33/10 |
| KR | 100647576 B1 | | 11/2006 | |
| KR | 100708633 B1 | | 4/2007 | |
| KR | 10-2009-0053418 | | 5/2009 | |
| KR | 10-2011-0088612 | | 8/2011 | |
| TW | 200923111 A | | 6/2009 | |
| TW | 201038754 A | | 11/2010 | |

OTHER PUBLICATIONS

Notification of Reason for Refusal dated Feb. 21, 2018 issued in Korean Patent Application No. 10-2012-0085354.

* cited by examiner

FRAME AND MASK ASSEMBLY HAVING THE SAME

CLAIM OF PRIORITY

This application claims priority to and the benefit of Korean Patent Application No. 10-2012-0085354 filed in the Korean Intellectual Property Office on Aug. 3, 2012, the entire contents of which are incorporated herein by reference.

BACKGROUND OF THE INVENTION

Field of the Invention

The described technology relates generally to a frame supporting a unit mask used while depositing an organic emission layer and a mask assembly having the same.

Description of the Related Art

A display device is a device for displaying an image, and recently, an organic light emitting diode display has received attention. Unlike a liquid crystal display device, the organic light emitting diode display has a self-emission characteristic and does not require a separate light source. As a result, a thickness of an organic light emitting diode display can have a reduced thickness and weight. Further, the organic light emitting diode display has high-grade characteristics such as low power consumption, high luminance, and a high response speed.

In order to manufacture the organic light emitting diode display, an electrode having a predetermined pattern and an organic emission layer need to be formed, and a deposition method using a mask assembly may be applied as a forming method thereof. In more detail, the organic light emitting diode display has a configuration in which pixels, which are basic units for displaying an image on a substrate, are arranged in a matrix form. In each pixel, an organic light emitting diode, in which a first electrode as a positive electrode and a second electrode as a negative electrode, are sequentially formed with respective organic emission layers therebetween emitting red light, green light, blue light, and white light. Here, since the organic emission layer must be completely isolated from moisture in a process of forming the organic emission layer as well as after forming the organic emission layer, and because the organic material forming the organic emission layer is very vulnerable to moisture, oxygen, and the like, it is difficult to perform patterning by using a general photolithography technique. Accordingly, the organic emission layer is formed by using a mask with an opened pattern part where deposition material passes through only a portion corresponding to each pattern.

Recently, a mask assembly including a frame having openings and a plurality of band-shaped unit masks of which both ends are fixed to the frame in response to the openings has been used. Since a known mask assembly is supported by the frame by applying tensile force in a longitudinal direction of the unit mask, there was a problem in that the frame is unintentionally deformed by the tensile force applied to the unit mask in the longitudinal direction.

The above information disclosed in this Background section is only for enhancement of understanding of the background of the described technology, and therefore it may contain information that does not constitute prior art as per 35 U.S.C. §102.

SUMMARY OF THE INVENTION

The described technology has been made in an effort to provide a frame having advantages of minimizing deformation due to tensile force applied in a longitudinal direction of a unit mask while reducing weight and material used, and a mask assembly having the same.

According to one aspect of the present invention, there is provided a frame supporting opposite ends of a unit mask to which tensile force is applied in a first direction, the frame including a frame main body part configured to form an opening exposing the unit mask and a first through hole arranged by passing through the frame main body part.

The plurality of unit masks may be arranged in a second direction crossing the first direction, the unit masks may be fixed to an upper surface of the frame main body part. The frame main body part may include two long sides opposing each other and extending in the second direction with the opening therebetween, two short sides opposing each other and extending in the first direction with the opening therebetween and four corners connecting the long sides to the short side. The first through hole may be arranged in a central area of each of the long sides. The first through hole may have a quadrangular shape extending in the second direction. The frame may also include a first groove recessed from a lower surface of the frame main body part and extending in the second direction from the first through hole to a one of the corners that is adjacent to the first through hole. The frame may include a plurality of first grooves. A width of each first groove taken in the first direction may increase from the first through hole to the corner. Each first through hole may include a plurality of first sub-through holes that are spaced-apart from each other by a center of a corresponding one of the long sides.

The frame may also include a second through hole arranged by passing through the short sides. The second through hole may extend from one of the corners to another of the corners at opposite ends of a corresponding one of the short sides. The second through hole may have a quadrangular shape extending in the first direction. The second through hole may include a plurality of second sub-through holes that are spaced-apart from each other by a center of the short side.

The frame may also include a first sloping side arranged between the second through hole and the opening to face the second through hole and inversely tapered from the upper surface of the frame main body part to the lower surface of the frame main body part, and a second sloping side arranged between the second through hole and an edge of the frame main body part to face the second through hole and tapered from the upper surface of the frame main body part to the lower surface of the frame main body part. A length of each of the first sloping side and the second sloping side extending in the first direction may be the same as a length of the second through hole. The first sloping side may be spaced-apart from the opening, and the second sloping side extends from the edge of the frame main body part.

The frame may also include a second groove arranged between the second through hole and the opening, facing the second through hole, and being recessed from the lower surface of the frame main body part, and a third groove arranged between the second through hole and an edge of the frame main body part, facing the second through hole, and being recessed from the upper surface of the frame main body part. A length taken in the first direction of each of the second groove and the third groove may be the same as that of the second through hole. The second groove may be spaced-apart from the opening, and the third groove is spaced-apart from the edge of the frame main body part.

According to another aspect of the present invention, there is provided the mask assembly including the a frame as indicated above and at least one of said masks, wherein the opposite ends of each unit mask is supported by the frame by applying tensile force in the first direction.

DETAILED DESCRIPTION OF THE INVENTION

Figure 1:
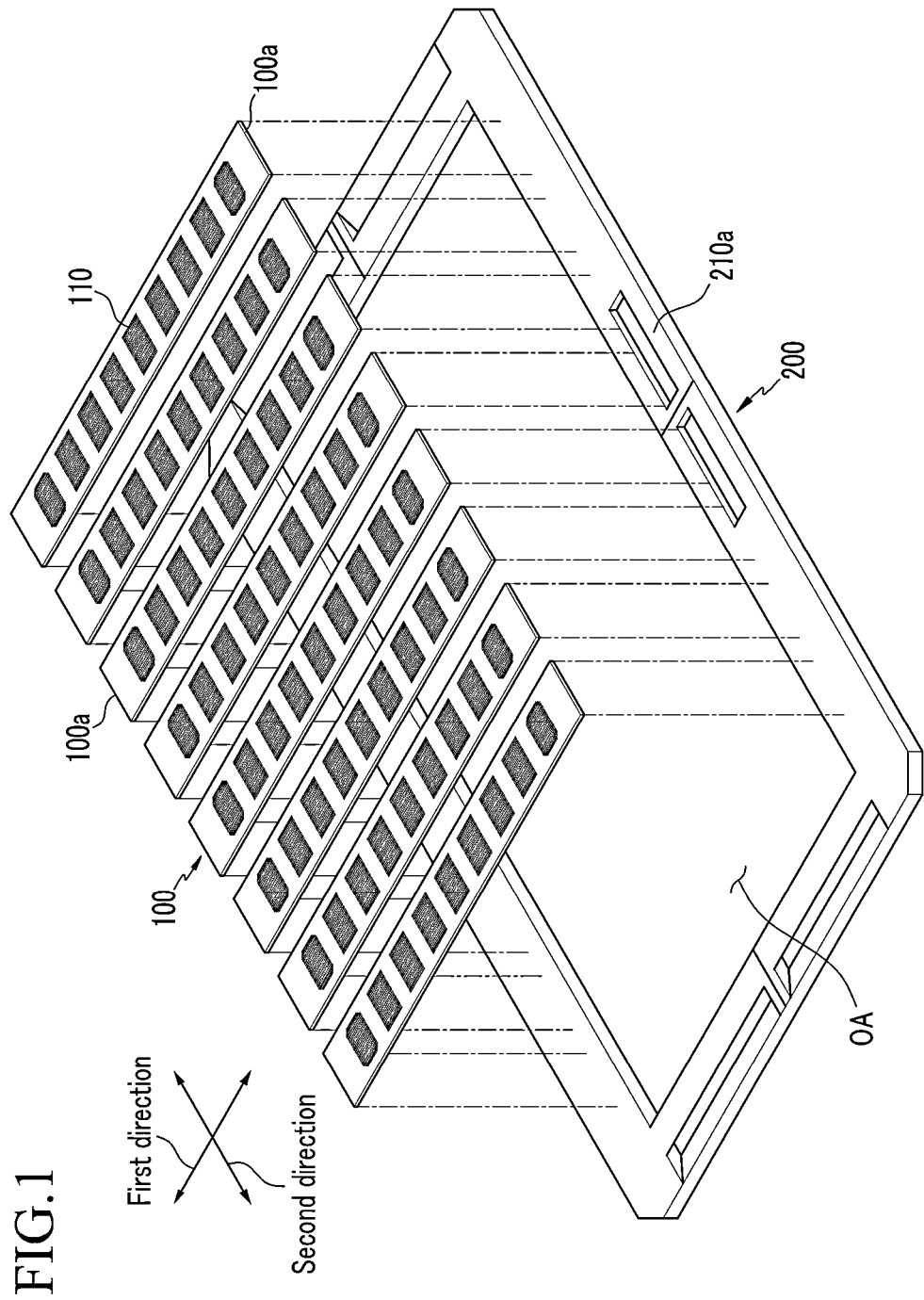
FIG. 1 is a perspective view illustrating a mask assembly according to a first exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification. Further, in exemplary embodiments, since like reference numerals designate like elements having the same configuration, a first exemplary embodiment is representatively described, and in other exemplary embodiments, only a configuration different from the first exemplary embodiment will be described. Further, since a size and a thickness of each element illustrated in the drawings are randomly illustrated for convenience of the description, the present invention is not necessarily limited to those shown in the drawings. In addition, unless explicitly described to the contrary, the word "comprise" and variations such as "comprises" or "comprising", will be understood to imply the inclusion of stated elements but not the exclusion of any other elements.

Hereinafter, a mask assembly according to a first exemplary embodiment will be described with reference to FIGS. 1 to 3. Turning now to FIG. 1, FIG. 1 is a perspective view illustrating a mask assembly according to a first exemplary embodiment.

As shown in FIG. 1, a mask assembly according to a first exemplary embodiment includes a plurality of unit masks 100 and a frame 200. Although the mask assembly illustrated in FIG. 1 shows a plurality of unit masks 100, but a mask assembly according to another exemplary embodiment may include only one unit mask.

The unit mask 100 has a band shape extending in a first direction, which is a longitudinal direction, and both ends 100a are supported by the frame 200 in a state where tensile force is applied in the first direction. In FIG. 1, there are a plurality of unit masks 100, each unit mask having a pattern part 110, and the plurality of unit masks 100, which are adjacent to each other in a second direction which is a width direction of the unit mask 100 crossing the first direction of the unit mask 100, are disposed on the frame 200. Both ends 100a of each unit mask 100 has a flat shape, but the shape is not limited thereto, and may instead be formed in other various shapes such as a horseshoe shape in which a central area is recessed or dented. The both ends 100a of each unit mask 100 is fixed to an upper surface 210a of a frame main body part 210 of the frame 200, and for example, may be attached by welding.

A plurality of pattern parts 110 is disposed on each unit mask 100 in the first direction. The pattern part 110 may include a plurality of stripe type slits. The pattern parts 110 may correspond to one organic light emitting diode display, and in this case, patterns configuring several organic light emitting diode displays may be simultaneously formed on a mother substrate to be manufactured through the unit mask 100 by a single process. That is, the pattern part 110 is disposed in the unit mask 100 in response to a deposition area of the patterns configuring the organic light emitting diode display. The pattern part 110 has an open pattern shape passing through the unit mask 100 so that the patterns configuring the organic light emitting diode display may be formed on the mother substrate through the pattern part 110.

The frame 200 fixes and supports the both ends 100a of each of the plurality of unit masks 100 to which tensile force is applied in the first direction. The unit mask 100 fixed to the frame 200 is supported by the unit mask 100 in a state where the tensile force is applied in the first direction. As a result, a compressive force is applied in the first direction which is a longitudinal or extending direction of the unit mask 100, and the frame 200 may be made of a metal material such as stainless steel having large hardness so that deformation due to the compressive force of the unit mask 100 fixed to the frame 200 does not occur.

Figure 2:
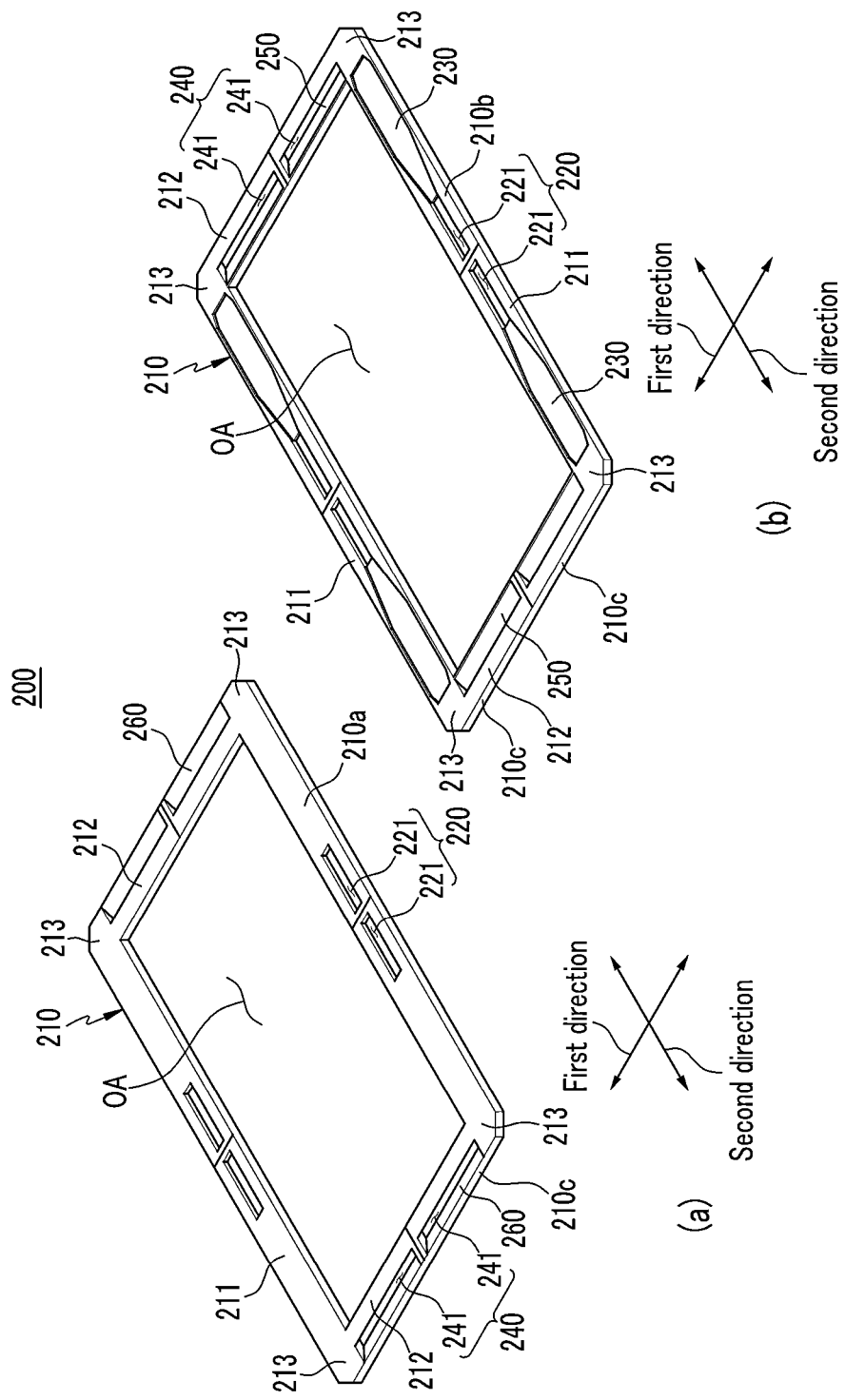
FIGS. 2A and 2B are diagrams illustrating a frame shown in FIG. 1.

Turning now to FIGS. 2A and 2B, FIGS. 2A and 2B are diagrams illustrating a frame shown in FIG. 1, where FIG. 2A is a diagram illustrating an upper side of the frame 200, and FIG. 2B is a diagram illustrating a lower side of the frame 200. As shown in FIG. 2, the frame 200 include the frame main body part 210, a first through hole 220, a first groove 230, a second through hole 240, a first sloping side 250, and a second sloping side 260.

The frame main body part 210 forms an opening OA exposing the pattern parts 110 of the unit masks 100 and extends in a closed loop form along a periphery of the opening OA. The frame main body part 210 has a quadrangular shape and includes a pair of long side 211, a pair of short side 212, and corner 213. The frame main body part 210 of FIGS. 2A and 2B have a quadrangular shape, but a frame main body part according to another exemplary embodiment may have a triangular, polygonal, or circular shape.

The long sides 211 extend in the second direction and have a longer length than the short sides 212. The first through hole 220 and the first groove 230 are formed in the long sides 211. The short sides 212 extend in the first direction and have a shorter length than the long sides 211. The second through hole 240, the first sloping side 250, and the second sloping side 260 are arranged within the short sides 212. There are four corners. Each corner 213 connects a long side 211 to an adjoining short side 212.

The first through hole 220 is formed about a central area of each long side 211 and is formed by passing through the frame main body part 210. The first through hole 220 has a quadrangular shape extending in the second direction. The first through hole 220 is formed by passing through the frame main body part 210, and as a result, a weight of the frame main body part 210 itself is minimized while simultaneously, tensile force applied to the frame 200 is dispersed due to the tensile force applied in the first direction which is the longitudinal direction of the unit mask 100, and as a result, the deformation of the frame 200 is minimized.

The first through hole 220 includes a plurality of first sub-through holes 221 which are separated from each other with the center of the long side 211 therebetween. By separating the first through holes 220 from each other, the strength deterioration of the frame 200 caused by the first through holes 220 is suppressed.

Each first groove 230 is recessed or dented from a lower surface 210b of the frame main body part 210 and extends from a corresponding first through hole 220 to a corresponding corner 213 adjacent to the first through hole 220 in the second direction. By forming first grooves 230, a weight of the frame main body part 210 itself is minimized while simultaneously, tensile force applied to the frame 200 is dispersed due to the tensile force applied in the first direction which is the longitudinal direction of the unit mask 100, and as a result, the deformation of the frame 200 is minimized.

The first grooves 230 are in plural, and each of the first grooves 230 is recessed from the lower surface 210b of the frame main body part 210 to extend from a first sub-through hole 221 to a corner 213 adjacent to the first sub-through hole 221 in the second direction. A width of the first groove 230 taken in the first direction increases when proceeding from the first sub-through hole 221 to the corner 213. That is, a width of the first groove 230 taken in the first direction decreases towards the first sub-through hole 221, and thus the strength deterioration of the frame 200 which may occur by the first groove 230 is suppressed.

The second through hole 240 is formed by passing through the short side 212. The second through hole 240 extends from one corner 213 to the other corner 213 of the adjacent corners 213. That is, the second through hole 240 connects the adjacent corners 213. The second through hole 240 has a quadrangular shape extending in the first direction. The second through hole 240 is formed by passing through the frame main body part 210, and as a result, a weight of the frame main body part 210 itself is minimized and simultaneously, tensile force applied to the frame 200 is dispersed due to the tensile force applied in the first direction which is the longitudinal direction of the unit mask 100, and as a result, the deformation of the frame 200 is minimized.

The second through hole 240 includes a plurality of second sub-through holes 241 which are separated from each other by the center of the short side 212. The second through hole 240 includes the plurality of second sub-through holes 241 which are separated from each other, and thus the strength deterioration of the frame 200 which may occur by the second through hole 240 is suppressed.

The first sloping side 250 is positioned between the second through hole 240 and the opening OA to face the second through hole 240. The first sloping side 250 has an inversely tapered shape from the upper surface 210a of the frame main body part 210 to the lower surface 210b of the frame main body part 210 and is separated from the opening OA. The first sloping side 250 extends in the first direction so that the length in the first direction is the same as the second through hole 240. The first sloping side 250 has the inversely tapered shape extending in the first direction by facing the second through hole 240, and as a result, a weight of the frame main body part 210 itself is minimized while simultaneously serving to disperse tensile force applied in the first direction, which is the longitudinal direction of the unit mask 100, and as a result, the deformation of the frame 200 is minimized.

The second sloping side 260 is positioned between the second through hole 240 and an edge 210c of the frame main body part 210 to face the second through hole 240. The second sloping side 260 has a tapered shape from the upper surface 210a of the frame main body part 210 to the lower surface 210b of the frame main body part 210 and extends from the edge 210c of the frame main body part 210. That is, an end of the second sloping side 260 bent-extends from the edge 210c of the frame main body part 210. The second sloping side 260 extends in the first direction so that the length in the first direction is the same as the second through hole 240. The second sloping side 260 has the tapered shape extending in the first direction by facing the second through hole 240, and as a result, a weight of the frame main body part 210 itself is minimized while simultaneously serving to disperse tensile force applied in the first direction that is the longitudinal direction of the unit mask 100, and as a result, deformation of the frame 200 is minimized.

Figure 3:
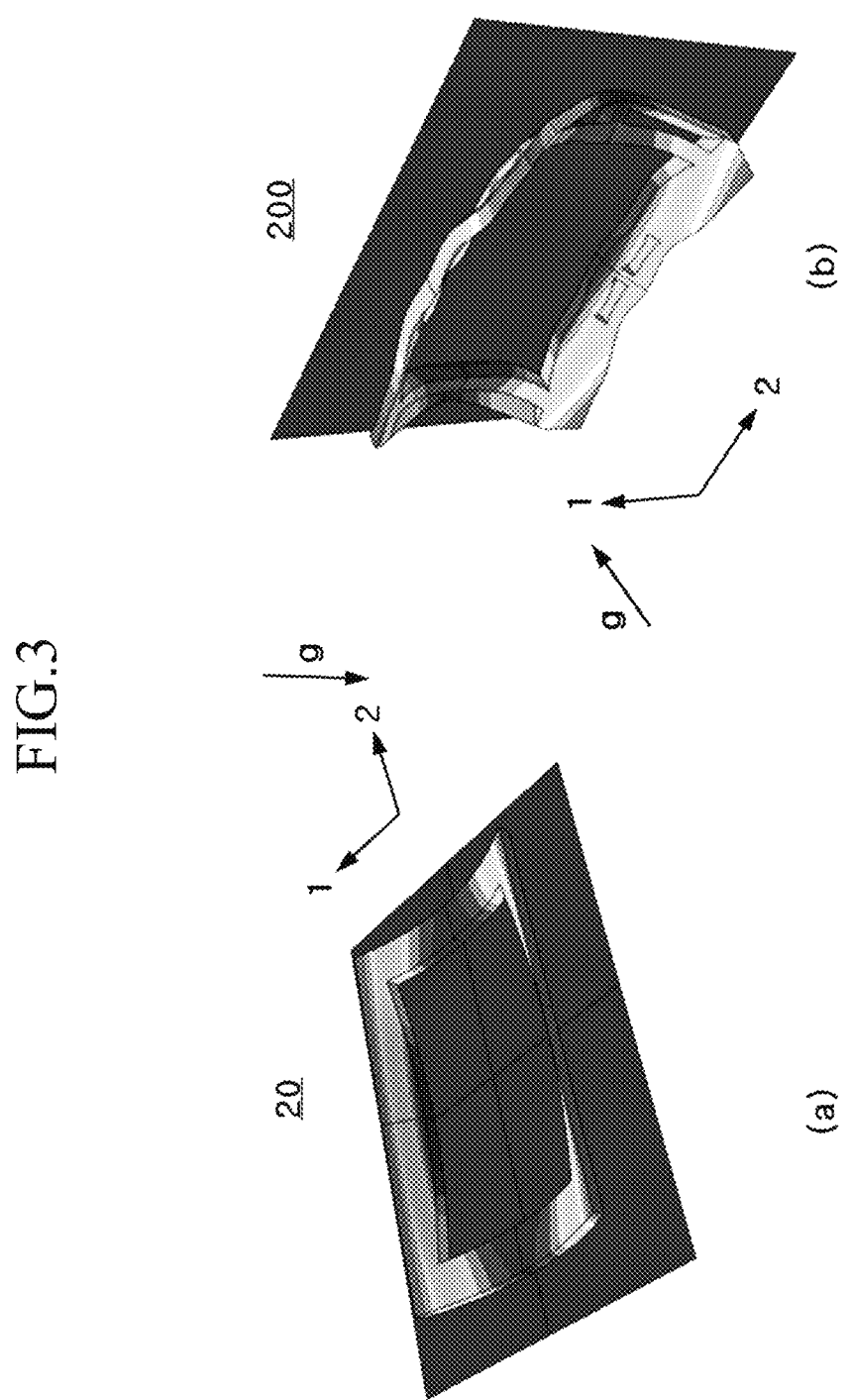
FIGS. 3A and 3B are diagrams for describing an effect of the frame shown in FIGS. 2A and 2B.

Hereinafter, an experiment verifying that deformation of the frame 200 of the mask assembly according to the first exemplary embodiment is minimized will be described with reference to FIG. 3, where Referring now to FIGS. 3A and 3B, FIGS. 3A and 3B are diagrams for describing an effect of the frame shown in FIG. 2. FIG. 3A is a diagram illustrating a frame according to Comparative Example, and FIG. 3B is a diagram illustrating Experimental Example of the frame of the mask assembly according to the first exemplary embodiment.

First, a comparative frame 20 according to Comparative Example shown in FIG. 3A was prepared. A length of an outer long side of the comparative frame 20 according to Comparative Example was 930 mm, a length of an outer short side was 550 mm, a length of an inner long side forming the opening was 730 mm, a length of an inner short side forming the opening was 400 mm, and a thickness was 40 mm. In the case where a unit mask tensioned by 0.08% in direction 1 was fixed to the comparative frame 20, when a simulation was performed by using a structure selling in SIMULIA of Dassault Systemes Co., Ltd and ABAQUS, which is an electric and thermal analysis tool, it was verified that deformation of 27.23 μm occurred in a g direction, which is a gravity direction of the comparative frame 20. A mass of the comparative frame 20 according to Comparative Example was set as 70.7 kg.

Next, the frame 200 of the mask assembly according to the first exemplary embodiment shown in FIG. 3B was prepared. A length of an outer long side of the frame 200 of the mask assembly according to the first exemplary embodiment shown was 930 mm, a length of an outer short side was 550 mm, a length of an inner long side forming the opening was 730 mm, a length of an inner short side forming the opening was 400 mm, and a thickness was 40 mm. In the case where the unit mask tensioned by 0.08% in the direction 1 was fixed to the frame 200, when a simulation was performed by using the ABAQUS, it was verified that deformation of 14.74 μm occurred in the g direction, which is a gravity direction in the frame 200. It was verified that a mass of the frame 200 was only 46.4 kg.

As those verified through the above experiment, the frame 200 of the mask assembly according to the first exemplary embodiment includes the first through hole 220, the first groove 230, the second through hole 240, the first sloping side 250, and the second sloping side 260, and as a result, since tensile force applied to the frame 200 is dispersed due to the tensile force applied in the first direction which is the longitudinal direction of the unit mask 100, the deformation of the frame 200 is minimized. Since this acts as a factor in suppressing a deposition error using the unit masks 100, reliability of the depositing process using the frame assembly is improved.

Further, the frame 200 of the mask assembly according to the first exemplary embodiment includes the first through hole 220, the first groove 230, the second through hole 240, the first sloping side 250, and the second sloping side 260, and as a result, since the weight of the frame 200 itself is minimized, handleability of the frame 200 and the frame assembly becomes easier. Since this acts as a factor in improving the ease of the entire deposition process, a time of the deposition process using the frame assembly is reduced.

Hereinafter, a frame according to a second exemplary embodiment will be described with reference to FIG. 4. Hereinafter, only characteristic components distinguished from the first exemplary embodiment will be extracted and described, and the components omitted from the description follow the first exemplary embodiment. In addition, in the second exemplary embodiment, for convenience for the description, like constituent elements will be described by using like reference numerals of the first exemplary embodiment.

Figure 4:
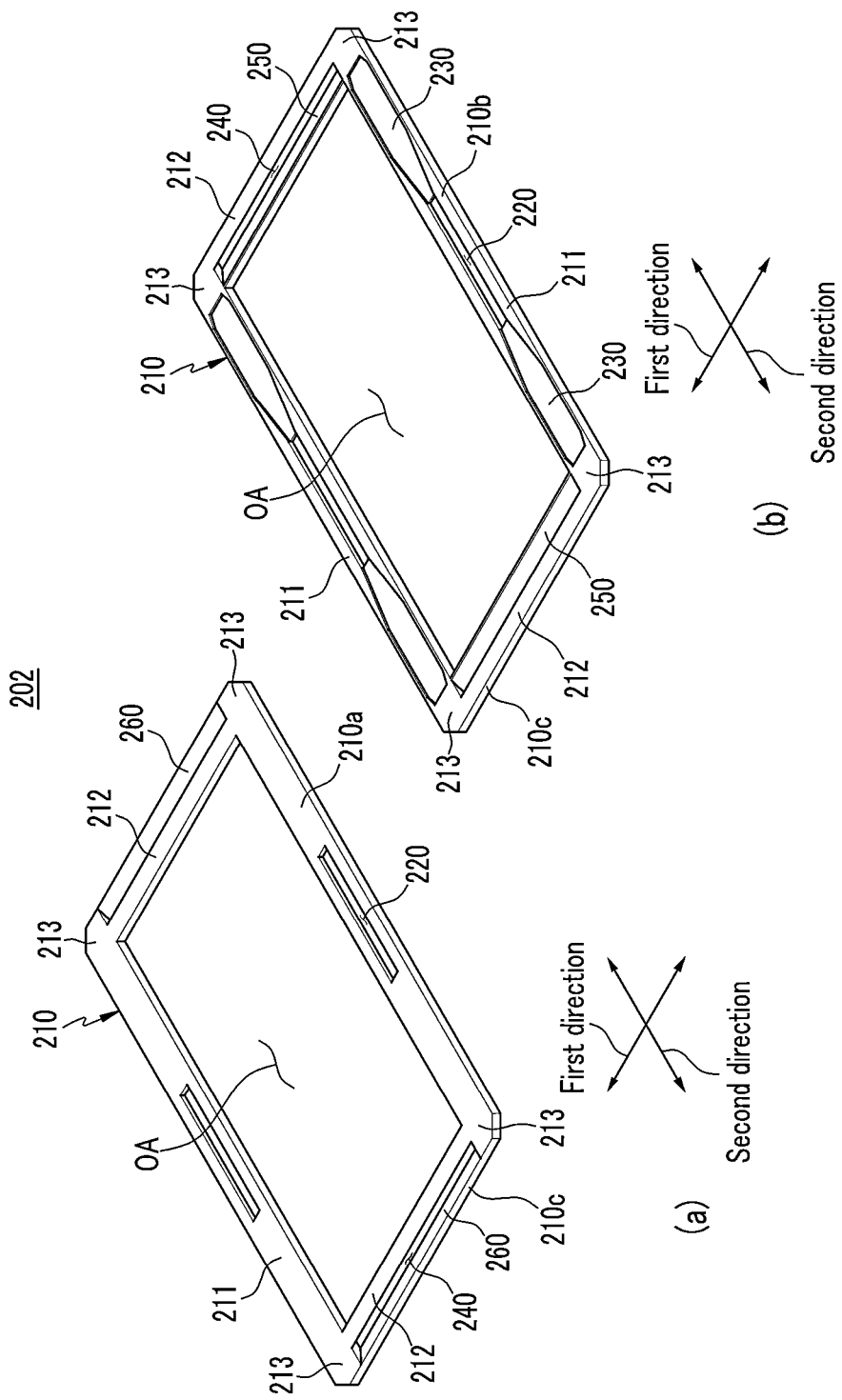
FIGS. 4A and 4B are diagrams illustrating a frame according to a second exemplary embodiment.

Turning now to FIGS. 4A and 4B, FIGS. 4A and 4B are diagrams illustrating a frame according to a second exemplary embodiment, where FIG. 4A is a diagram illustrating an upper side of a frame 202, and FIG. 4B is a diagram illustrating a lower side of the frame 202. As shown in FIG. 4, the frame 202 includes a frame main body part 210, a first through hole 220, a first groove 230, a second through hole 240, a first sloping side 250, and a second sloping side 260, where the first through hole 220 passes through the center of a long side 211 and the second through hole 240 passes through the center of a short side 212.

As described above, in the frame 202 according to the second exemplary embodiment, as compared with the frame 200 of the first embodiment, the first through hole 220 and the second through hole 240 pass through the centers of the long side 211 and the short side 212, respectively, and as a result, since the weight of the frame 202 itself is minimized as compared with the frame 200 according to the first exemplary embodiment, handleability of the frame 202 and the frame assembly becomes easier. Since this acts as a factor of improving the ease of the entire depositing process, a time of the depositing process using the frame assembly is reduced.

Figure 5:
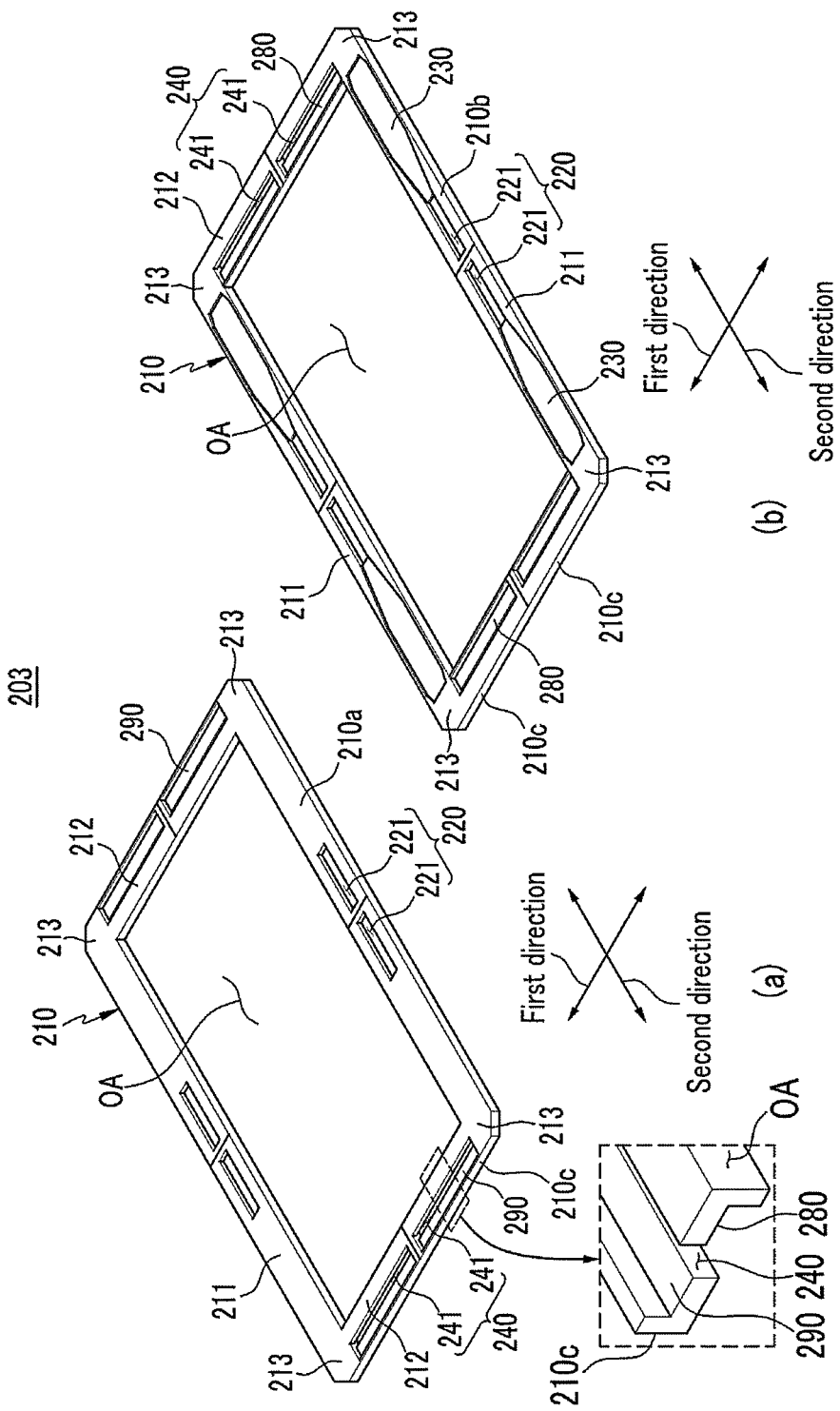
FIGS. 5A and 5B are diagrams illustrating a frame according to a third exemplary embodiment.
Figure 6:
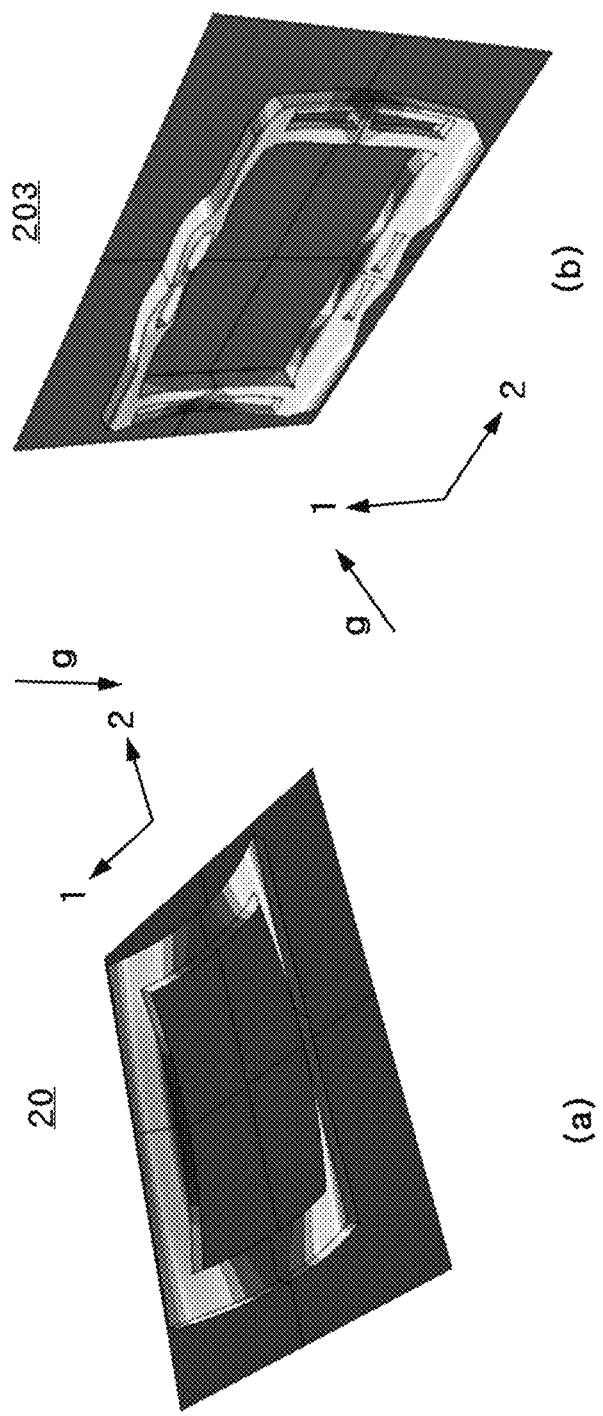
FIGS. 6A and 6B are diagrams for describing an effect of the frame shown in FIGS. 5A and 5B.

Hereinafter, a frame according to a third exemplary embodiment will be described with reference to FIGS. 5a through 6.

Hereinafter, only characteristic components distinguished from the first exemplary embodiment will be extracted and described, and the components omitted from the description follow the first exemplary embodiment. Further, in the third exemplary embodiment, for convenience for the description, like constituent elements will be described by using like reference numerals of the first exemplary embodiment.

Turning now to FIGS. 5A and 5B, FIGS. 5A and 5B are diagrams illustrating a frame according to a third exemplary embodiment, where FIG. 5A is a diagram illustrating an upper side of a frame 203, and FIG. 5B is a diagram illustrating a lower side of the frame 203. As shown in FIGS. 5A and 5B, the frame 203 includes a frame main body part 210, a first through hole 220, a first groove 230, a second through hole 240, a second groove 280, and a third groove 290.

The second groove 280 is positioned between the second through hole 240 and an opening OA to face the second through hole 240. The second groove 280 is recessed from the lower surface 210b of the frame main body part 210 and separated from the opening OA. The second groove 280 extends in a first direction so that a length in the first direction is the same as the second through hole 240. The second groove 280 is recessed from the lower surface 210b of the frame main body part 210 by facing the second through hole 240, and as a result, a weight of the frame main body part 210 is reduced and a tensile force applied to the frame 203 can be dispersed due to the tensile force applied in the first direction which is the longitudinal direction of the unit mask 100, and as a result, the deformation of the frame 203 is minimized.

The third groove 290 is positioned between the second through hole 240 and the edge 210c of the frame main body part 210 to face the second through hole 240. The third groove 290 is recessed from the upper surface 210a of the frame main body part 210 and separated from the edge 210c of the frame main body part 210. The third groove 290 extends in the first direction and has a length that is the same as the second through hole 240. The third groove 290 is recessed from the upper surface 210a of the frame main body part 210 by facing the second through hole 240, and as a result, a weight of the frame main body part 210 itself is reduced while a tensile force applied to the frame 203 by the unit mask 100 is dispersed, resulting in less deformation of the frame 203.

Hereinafter, an experiment verifying that deformation of the frame 203 of the mask assembly according to the third exemplary embodiment is minimized will be described with reference to FIGS. 6A and 6B. Turning now to FIGS. 6A and 6B, FIGS. 6A and 6B are diagrams for describing an effect of the frame shown in FIGS. 5A and 5B, where FIG. 6A is a diagram illustrating a frame according to Comparative Example, and FIG. 6B is a diagram illustrating Experimental Example of the frame according to the third exemplary embodiment.

First, a comparative frame 20 according to Comparative Example shown in FIG. 6A was prepared. A length of an outer long side of the comparative frame 20 according to Comparative Example was 930 mm, a length of an outer short side was 550 mm, a length of an inner long side forming the opening was 730 mm, a length of an inner short side forming the opening was 400 mm, and a thickness was 40 mm. In the case where a unit mask tensioned by 0.08% in direction 1 was fixed to the comparative frame 20, when a simulation was performed by using a structure selling in SIMULIA of Dassault Systemes Co., Ltd and ABAQUS which is an electric and thermal analysis tool, it was verified that deformation of 27.23 μm occurred in a g direction, which is a gravity direction, in the comparative frame 20. A mass of the comparative frame 20 according to Comparative Example was set as 70.7 kg.

Next, the frame 203 according to the third exemplary embodiment shown in FIG. 6B was prepared. A length of an outer long side of the frame 203 according to the third exemplary embodiment shown was 930 mm, a length of an outer short side was 550 mm, a length of an inner long side forming the opening was 730 mm, a length of an inner short side forming the opening was 400 mm, and a thickness was 40 mm. In the case where the unit mask tensioned by 0.08% in direction 1 was fixed to the frame 203, when a simulation was performed by using the ABAQUS, it was verified that deformation of 7.57 μm occurred in a g direction, which is a gravity direction in the frame 203. It was verified that a mass of the frame 203 was only 46.6 kg.

As those verified through the above experiment, the frame 203 of the mask assembly according to the third exemplary embodiment includes the first through hole 220, the first groove 230, the second through hole 240, the second groove 280, and the third groove 290. As a result, since tensile force applied to the frame 203 is dispersed due to the tensile force applied in the first direction, which is the longitudinal direction of the unit mask 100, the deformation of the frame 203 is minimized. Since reducing deformation of frame 203 acts as a factor in suppressing a deposition error using the unit mask 100, reliability of the depositing process using the frame assembly is improved.

Further, the frame 203 of the mask assembly according to the third exemplary embodiment includes the first through hole 220, the first groove 230, the second through hole 240, the second groove 280, and the third groove 290, and as a result, since the weight of the frame 203 itself is minimized, handleability of the frame 203 and the frame assembly becomes easier. Since this acts as a factor of improving the ease of the entire deposition process, a time of the deposition process using the frame assembly is reduced.

Figure 7:
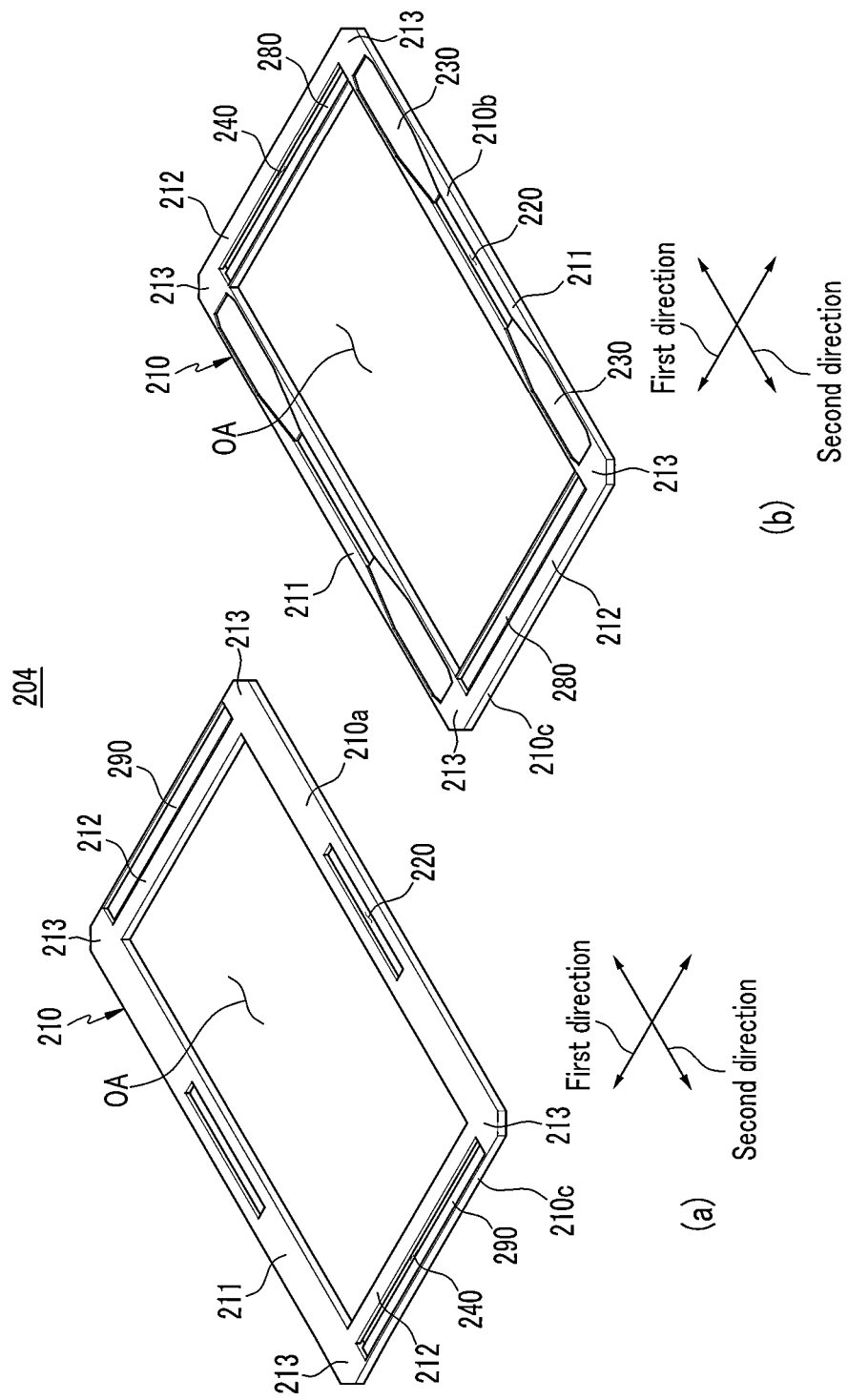
FIGS. 7A and 7B are diagrams illustrating a frame according to a fourth exemplary embodiment.

Hereinafter, a frame according to a fourth exemplary embodiment will be described with reference to FIG. 7.

Hereinafter, only characteristic components distinguished from the third exemplary embodiment will be extracted and described, and the components omitted from the description follow the third exemplary embodiment. Further, in the fourth exemplary embodiment, for convenience for the description, like constituent elements will be described by using like reference numerals of the first exemplary embodiment.

Turning now to FIGS. 7A and 7B, FIGS. 7A and 7B are diagrams illustrating a frame according to a fourth exemplary embodiment, where FIG. 7A is a diagram illustrating an upper side of a frame 204, and FIG. 7B is a diagram illustrating a lower side of the frame 204.

As shown in FIGS. 7A and 7B, the frame 204 includes a frame main body part 210, a first through hole 220, a first groove 230, a second through hole 240, a second groove 280, and a third groove 290, where the first through hole 220 passes through the center of a long side 211 and the second through hole 240 passes through the center of a short side 212.

As described above, in the frame 204 according to the fourth exemplary embodiment, as compared with the frame 203 according to the third exemplary embodiment, the first through hole 220 and the second through hole 240 pass through the centers of the long side 211 and the short side 212, respectively, and as a result, since the weight of the frame 204 itself is minimized as compared with the frame 203 according to the third exemplary embodiment, handleability of the frame 204 and the frame assembly becomes easier. Since this acts as a factor of improving the ease of the entire deposition process, a time of the deposition process using the frame assembly is reduced.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

Unit mask 100,
Ends of unit mask 100a,
Pattern part 110,
Frame 200, 202, 203 and 204,
Frame main body part 210,
Upper surface of frame main body 210a,
Lower surface of frame main body 210b,
Frame edge 210c,
Opening in Frame OA,
Long side 211,
Short side 212,
Corner 213,
First through part 220,
First sub through parts 221,
First groove 230,
Second through part 240,
Second sub through part 241,
First sloping side 250,
Second sloping side 260,
Second groove 280,
Third groove 290.

What is claimed is:

1. A frame supporting opposite ends of each of a plurality of unit masks to which a tensile force is applied in a first direction, the frame comprising:
   a frame main body part comprising an opening exposing the unit masks, the frame main body part having a pair of sides that extend in the first direction and a pair of sides that extend in a second direction orthogonal to the first direction;
   a first through hole arranged by passing through the frame main body part in a thickness direction of the frame main body part that is orthogonal to each of the first and second directions;
   a second through hole arranged by passing through the frame main body part;
   a first sloping side arranged between the second through hole and the opening to face the second through hole and inversely tapered from an upper surface of the frame main body part to a lower surface of the frame main body part; and
   a second sloping side arranged between the second through hole and an edge of the frame main body part to face the second through hole and tapered from the upper surface of the frame main body part to the lower surface of the frame main body part.

2. The frame of claim 1, wherein the plurality of unit masks are arranged in the second direction crossing the first direction, the unit masks being fixed to the upper surface of the frame main body part.

3. The frame of claim 2, wherein the frame main body part comprises:
   two long sides opposing each other and extending in the second direction with the opening therebetween;
   two short sides opposing each other and extending in the first direction with the opening therebetween; and
   four corners connecting the long sides to the short sides, wherein each of the plurality of unit masks are attached to the two long sides only and not to any of the two short sides.

4. The frame of claim 3, wherein the first through hole is arranged in a central area of each of the long sides and is spaced apart from each of the opening and an outer edge of the frame in the first direction.

5. The frame of claim 4, wherein the first through hole has a quadrangular shape extending in the second direction, the first through hole being spaced apart in the first direction from the opening by a portion of one of the long sides that is external to the first through hole.

6. The frame of claim 4, further comprising a first groove recessed from the lower surface of the frame main body part and extending in the second direction from the first through hole to one of the corners that is adjacent to the first through hole, the first groove being spaced apart from the opening in the first direction by a portion of one of the long sides that is external to each of the first groove and the first through hole.

7. The frame of claim 6, wherein the frame includes a plurality of first grooves.

8. The frame of claim 7, wherein a width of each of the plurality of first grooves taken in the first direction increases from the first through hole to a corresponding one of the corners.

9. The frame of claim 4, wherein the first through hole comprises a plurality of first sub-through holes that are spaced apart from each other by a center of a corresponding one of the long sides.

10. The frame of claim 3, wherein the second through hole is arranged by passing through the short sides.

11. The frame of claim 10, wherein the second through hole extends from one of the corners to another of the corners at opposite ends of a corresponding one of the short sides.

12. The frame of claim 11, wherein the second through hole has a quadrangular shape extending in the first direction.

13. The frame of claim 11, wherein the second through hole includes a plurality of second sub-through holes that are spaced apart from each other by a center of the short side.

14. A frame supporting opposite ends of a unit mask to which tensile force is applied in a first direction, the frame comprising:
a frame main body part comprising an opening exposing the unit mask, wherein the frame main body part comprises:
two long sides opposing each other and extending in the second direction with the opening therebetween,
two short sides opposing each other and extending in the first direction with the opening therebetween, and
four corners connecting the long sides to the short sides;
a first through hole arranged by passing through the frame main body part, wherein a plurality of unit masks is arranged in a second direction crossing the first direction, the unit masks being fixed to an upper surface of the frame main body part;
a second through hole arranged by passing through the short sides;
a first sloping side arranged between the second through hole and the opening to face the second through hole and inversely tapered from the upper surface of the frame main body part to a lower surface of the frame main body part; and
a second sloping side arranged between the second through hole and an edge of the frame main body part to face the second through hole and tapered from the upper surface of the frame main body part to the lower surface of the frame main body part.

15. The frame of claim 14, wherein a length of each of the first sloping side and the second sloping side extending in the first direction may be the same as a length of the second through hole.

16. The frame of claim 14, wherein the first sloping side is spaced apart from the opening, and the second sloping side extends from the edge of the frame main body part.

17. The frame of claim 10, further comprising:
a second groove arranged between the second through hole and the opening, facing the second through hole, and being recessed from the lower surface of the frame main body part; and
a third groove arranged between the second through hole and an outer edge of the frame main body part, facing the second through hole, and being recessed from the upper surface of the frame main body part.

18. The frame of claim 17, wherein a length taken in the first direction of each of the second groove and the third groove is the same as that of the second through hole.

19. The frame of claim 17, wherein the second groove is spaced apart from the opening, and the third groove is spaced apart from the edge of the frame main body part.

20. A mask assembly, comprising:
a unit mask;
a frame comprising:
a frame main body part comprising an opening exposing the unit mask, the frame main body part having a pair of sides that extend in a first direction and a pair of sides that extend in a second direction orthogonal to the first direction;
a first through hole arranged by passing through the frame main body part in a thickness direction of the frame main body part that is orthogonal to each of the first and second directions;
a second through hole arranged by passing through the frame main body part;
a first sloping side arranged between the second through hole and the opening to face the second through hole and inversely tapered from an upper surface of the frame main body part to a lower surface of the frame main body part; and
a second sloping side arranged between the second through hole and an edge of the frame main body part to face the second through hole and tapered from the upper surface of the frame main body part to the lower surface of the frame main body part, wherein the opposite ends of the unit mask are supported by the frame by applying tensile force in the first direction.

* * * * *